(12) United States Patent
Kraft et al.

(10) Patent No.: US 9,850,403 B2
(45) Date of Patent: Dec. 26, 2017

(54) COBALT POLISHING ACCELERATORS

(71) Applicant: Cabot Microelectronics Corporation, Aurora, IL (US)

(72) Inventors: Steven Kraft, Naperville, IL (US); Andrew Wolff, Darien, IL (US); Phillip W. Carter, Round Lake, IL (US); Kristin Hayes, St. Charles, IL (US); Benjamin Petro, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/603,634

(22) Filed: May 24, 2017

(65) Prior Publication Data
US 2017/0260421 A1 Sep. 14, 2017

Related U.S. Application Data

(62) Division of application No. 14/919,449, filed on Oct. 21, 2015, now Pat. No. 9,688,885.

(60) Provisional application No. 62/066,484, filed on Oct. 21, 2014, provisional application No. 62/197,992, filed on Jul. 28, 2015.

(51) Int. Cl.
| | |
|---|---|
| *H01L 21/302* | (2006.01) |
| *H01L 21/461* | (2006.01) |
| *C09G 1/02* | (2006.01) |
| *B24B 37/04* | (2012.01) |
| *C23F 3/04* | (2006.01) |
| *H01L 21/321* | (2006.01) |

(52) U.S. Cl.
CPC .............. *C09G 1/02* (2013.01); *B24B 37/044* (2013.01); *C23F 3/04* (2013.01); *H01L 21/3212* (2013.01)

(58) Field of Classification Search
USPC .......................................... 438/693
See application file for complete search history.

(56) References Cited

U.S. PATENT DOCUMENTS

| | | | |
|---|---|---|---|
| 2013/0140273 A1* | 6/2013 | Lu | ............................ C09G 1/02 216/53 |
| 2016/0068710 A1* | 3/2016 | Wang | .................. H01L 21/3212 438/693 |

* cited by examiner

*Primary Examiner* — Roberts Culbert
(74) *Attorney, Agent, or Firm* — Thomas Omholt; Erika S. Wilson; Francis J. Koszyk

(57) ABSTRACT

The invention provides a chemical-mechanical polishing composition comprising (a) abrasive particles, (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof, (c) a cobalt corrosion inhibitor, (d) an oxidizing agent that oxidizes a metal, and (e) water, wherein the polishing composition has a pH of about 3 to about 8.5. The invention further provides a method of chemically-mechanically polishing a substrate with the inventive chemical-mechanical polishing composition. Typically, the substrate contains cobalt.

10 Claims, No Drawings

COBALT POLISHING ACCELERATORS

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process whereby material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Cobalt is emerging as a metal for integration into advanced integrated circuit devices. Effective integration of cobalt will require CMP methods with high removal rates, good planarization efficiency, low dishing and erosion, and low defectivity. At pH 9.5 and above, cobalt forms an insoluble, passivating oxide-hydroxide coating. Below that pH, cobalt readily reacts with water to form soluble, hydrated Co(II) species. U.S. Patent Application Publication 2014/0243250 A1 discloses polishing compositions exhibiting moderate cobalt removal rates at pH 9.0 and above, but requires high particle loading and high downforce pressure, which are disadvantageous from economic and processing viewpoints.

Thus, a need remains in the art for polishing compositions that provide high cobalt removal rates while exhibiting acceptable dishing and erosion and low defectivity.

BRIEF SUMMARY OF THE INVENTION

The invention provides a chemical-mechanical polishing composition comprising (a) abrasive particles, (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof, (c) a cobalt corrosion inhibitor, (d) an oxidizing agent that oxidizes cobalt, and (e) water, wherein the polishing composition has a pH of about 3 to about 8.5.

The invention also provides a method of chemically mechanically polishing a substrate comprising (i) contacting a substrate with a polishing pad and a chemical-mechanical polishing composition comprising (a) abrasive particles, (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof, (c) a cobalt corrosion inhibitor, (d) an oxidizing agent that oxidizes cobalt, and (e) water, wherein the polishing composition has a pH of about 3 to about 8.5, (ii) moving the polishing pad and the chemical-mechanical polishing composition relative to the substrate, and (iii) abrading at least a portion of the substrate to polish the substrate.

DETAILED DESCRIPTION OF THE INVENTION

The invention provides a chemical-mechanical polishing composition comprising, consisting essentially of, or consisting of (a) abrasive particles, (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof, (c) a cobalt corrosion inhibitor, (d) an oxidizing agent that oxidizes cobalt, and (e) water, wherein the polishing composition has a pH of about 3 to about 8.5.

The polishing composition comprises an abrasive (i.e., one or more abrasives). The abrasive can be any suitable abrasive or combination of abrasives in the form of particles. The abrasive can be any suitable abrasive, for example, the abrasive can be natural or synthetic, and can comprise metal oxide, carbide, nitride, carborundum, diamond, and the like. The abrasive also can be a polymer particle or a coated particle. The abrasive desirably comprises, consists essentially of, or consists of a metal oxide. Typically, the metal oxide is selected from the group consisting of silica, alumina, (e.g., alpha alumina particles (i.e., α-alumina), gamma alumina particles (i.e., γ-alumina), delta alumina particles (i.e., δ-alumina), or fumed alumina particles), ceria, zirconia, co-formed products thereof, and combinations thereof. The abrasive particles are desirably anionic in preferred embodiments.

Preferably, the chemical-mechanical polishing composition comprises a silica abrasive. The silica can be any suitable silica, for example, the silica can be a wet-process silica or a fumed silica. Preferably, the silica is a wet-process silica.

The wet-process silica can be any suitable wet-process silica. For example, the wet-process silica can be condensation-polymerized silica. Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 1060, 2327, and 2329 products, as well as other similar products available from DuPont, Bayer, Applied Research, Nissan Chemical, Fuso, and Clariant.

The abrasive particles can have any suitable surface charge. Preferably, the abrasive particles are anionic abrasive particles. By "anionic" is meant that the abrasive particles have a negative surface charge at the pH of the polishing composition. The abrasive particles can be anionic in their natural state at the pH of the polishing composition, or the abrasive particles can be rendered anionic at the pH of the polishing composition using any method known to those of ordinary skill in the art, such as, for example, by surface metal doping, e.g., by doping with aluminum ions, or by surface treatment with a tethered organic acid, a tethered sulfur-based acid, or a tethered phosphorus-based acid.

The abrasive can have any suitable average particle size (i.e., average particle diameter). The abrasive can have an average particle size of about 5 nm or more, e.g., about 10 nm or more, about 15 nm or more, about 20 nm or more, about 25 nm or more, about 30 nm or more, about 35 nm or more, or about 40 nm or more. Alternatively, or in addition, the abrasive can have an average particle size of about 150 nm or less, e.g., about 140 nm or less, about 130 nm or less, about 120 nm or less, about 110 nm or less, or about 100 nm or less. Thus, the abrasive can have a maximum in a particle size distribution bounded by any two of the above endpoints. For example, the abrasive can have an average particle size of about 5 nm to about 150 nm, about 10 nm to about 140 nm, about 15 nm to about 130 nm, about 20 nm to about 120 nm, about 20 nm to about 110 nm, about 20 nm to about 100 nm, about 30 nm to about 150 nm, about 30 nm to about 140 nm, about 30 nm to about 130 nm, about 30 nm to about 120 nm, about 30 nm to about 110 nm, about 30 nm to about 100 nm, about 35 nm to about 150 nm, about 35 nm to about 140 nm, about 35 nm to about 130 nm, about 35 nm to about 120 nm, about 35 nm to about 110 nm, or about 35 nm to about 100 nm. For spherical abrasive particles, the size of the particle is the diameter of the particle. For non-spherical abrasive particles, the size of the particle is the diameter of the smallest sphere that encompasses the particle. The particle size of the abrasive can be measured using any suitable technique, for example, using laser diffraction techniques. Suitable particle size measurement instruments are available from, for example, Malvern Instruments (Malvern, UK).

The abrasive particles preferably are colloidally stable in the inventive polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable amount of abrasive particles. If the polishing composition of the invention comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition can comprise about 10 wt % or less of abrasive, for example, about 9 wt % or less, about 8 wt % or less, about 7 wt % or less, about 6 wt % or less, about 5 wt % or less, about 4 wt % or less, about 3 wt % or less, about 2 wt % or less, about 1.5 wt % or less, about 1 wt. % or less, about 0.9 wt % or less, about 0.8 wt % or less, about 0.7 wt % or less, about 0.6 wt % or less, or about 0.5 wt % or less of abrasive. Alternatively, or in addition, the polishing composition can comprise about 0.05 wt % or more of abrasive, for example, about 0.1 wt % or more, about 0.2 wt % or more, about 0.3 wt % or more, about 0.4 wt % or more, about 0.5 wt % or more, or about 1 wt % or more. Thus, the polishing composition can comprise abrasive in an amount bounded by any two of the aforementioned endpoints. For example, the polishing composition can comprise about 0.05 wt % to about 10 wt % of abrasive, for example, 0.1 wt % to about 10 wt %, about 0.1 wt % to about 9 wt %, about 0.1 wt % to about 8 wt %, about 0.1 wt % to about 7 wt %, about 0.1 wt % to about 6 wt %, about 0.1 wt % to about 5 wt %, about 0.1 wt % to about 4 wt %, about 0.1 wt % to about 3 wt %, about 0.1 wt % to about 2 wt %, about 0.2 wt % to about 2 wt %, about 0.3 wt % to about 2 wt %, about 0.4 wt % to about 2 wt %, about 0.5 wt % to about 2 wt %, about 0.1 wt % to about 1.5 wt %, about 0.2 wt % to about 1.5 wt %, about 0.3 wt % to about 1.5 wt %, about 0.4 wt % to about 1.5 wt %, about 0.5 wt % to about 1.5 wt %, about 0.1 wt % to about 1 wt %, about 0.2 wt % to about 1 wt %, about 0.3 wt % to about 1 wt %, about 0.4 wt % to about 1 wt %, or about 0.5 wt % to about 1 wt % of abrasive.

The polishing comprises a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl) amino acids; unsubstituted heterocycles; alkyl-substituted heterocycles; substituted-alkyl-substituted heterocycles; N-aminoalkyl-α-amino acids; and combinations thereof.

The cobalt accelerator can be any suitable cobalt accelerator selected from the classes of compounds recited herein. In preferred embodiments, the cobalt accelerator is iminodiacetic acid, 2-[bis(2-hydroxyethyl)amino]-2-(hydroxymethyl)-1,3-propanediol, bicine, picolinic acid, dipicolinic acid, histidine, [(2-amino-2-oxoethyl)amino]acetic acid, imidazole, N-methylimidazole, lysine, or combinations thereof.

The cobalt accelerator can be present in the polishing composition in any suitable concentration. Typically, the cobalt accelerator can be present in the polishing composition in a concentration of about 5 mM or more, for example, about 10 mM or more, about 15 mM or more, about 20 mM or more, about 25 mM or more, about 30 mM or more, about 35 mM or more, about 40 mM or more, about 45 mM or more, or about 50 mM or more. Alternatively, or in addition, the cobalt accelerator can be present in the polishing composition in a concentration of about 100 mM or less, for example, about 95 mM or less, about 90 mM or less, about 85 mM or less, about 80 mM or less, about 75 mM or less, about 70 mM or less, about 65 mM or less, or about 60 mM or less. Thus, the cobalt accelerator can be present in the polishing composition in a concentration bounded by any two of the aforementioned endpoints. For example, the cobalt accelerator can be present in the polishing composition in a concentration of about 5 mM to about 100 mM, for example, about 5 mM to about 90 mM, about 5 mM to about 80 mM, about 5 mM to about 70 mM, about 5 mM to about 60 mM, about 10 mM to about 100 mM, about 10 mM to about 90 mM, about 10 mM to about 80 mM, about 10 mM to about 70 mM, about 10 mM to about 60 mM, about 20 mM to about 100 mM, about 20 mM to about 90 mM, about 20 mM to about 80 mM, about 20 mM to about 70 mM, or about 20 mM to about 60 mM.

The polishing composition comprises a cobalt corrosion inhibitor. The cobalt corrosion inhibitor can be any suitable cobalt corrosion inhibitor. In an embodiment, the cobalt corrosion inhibitor comprises an anionic head group and a $C_8$-$C_{14}$ aliphatic tail group, for example, a $C_8$-$C_{14}$ alkyl or a $C_8$-$C_{14}$ alkenyl tail group. The anionic head group can be any suitable anionic head group. In a preferred embodiment, the cobalt corrosion inhibitor comprises a sarcosine derivative having the structure: R—CON(CH$_3$)CH$_2$COOH wherein CON(CH$_3$)CH$_2$COOH forms the head group and R forms the tail group. The R group is typically an $C_8$-$C_{13}$ aliphatic group and can be a $C_8$-$C_{13}$ alkyl group or a $C_8$-$C_{13}$ alkenyl group, for example, a $C_8$ alkyl group, a $C_9$ alkyl group, $C_{10}$ alkyl group, $C_{11}$ alkyl group, $C_{12}$ alkyl group, $C_{13}$ alkyl group, $C_8$ alkenyl group, $C_9$ alkenyl group, $C_{10}$ alkenyl group, $C_{11}$ alkenyl group, $C_{12}$ alkenyl group, or $C_{13}$ alkenyl group. In a preferred embodiment wherein the cobalt corrosion inhibitor is a sarcosine derivative, conventional naming of the tail group includes the carbonyl to which the R group is attached for carbon counting purposes. Thus, a $C_{12}$ sarcosinate refers to a lauroyl sarcosinate. When the tail group is an alkenyl group, wherein the double bond is not at the terminus of the tail group, the alkenyl group can have the E configuration or the Z configuration, or can be a mixture of E and Z isomers. The cobalt corrosion inhibitor can be a single compound, or can be a mixture of two or more compounds having an anionic head group and a $C_8$-$C_{20}$ aliphatic tail group or a mixture of two or more sarcosine derivatives as described herein having an $C_7$-$C_{19}$ aliphatic R group, provided that about 75 wt % or more (e.g., about 80 wt % or more, about 85 wt % or more, about 90 wt % or more, or about 95 wt % or more) of the compounds comprise an anionic head group and a $C_8$-$C_{14}$ aliphatic tail group or are sarcosine derivatives having $C_8$-$C_{13}$ aliphatic R groups.

The polishing composition can comprise any suitable amount of the cobalt corrosion inhibitor. The polishing composition can comprise about 1 ppm or more of the cobalt corrosion inhibitor, for example, about 5 ppm or more, about 10 ppm or more, about 20 ppm or more, about 30 ppm or more, about 40 ppm or more, or about 50 ppm or more. Alternatively, or in addition, the polishing composition can comprise about 1000 ppm or less of the cobalt corrosion inhibitor, for example, about 900 ppm or less, about 800 ppm or less, about 700 ppm or less, about 600 ppm or less, about 500 ppm or less, about 400 ppm or less, about 300 ppm or less, or about 200 ppm or less. Thus, the polishing composition can comprise the cobalt corrosion inhibitor in an amount bounded by any two of the aforementioned endpoints. For example, the polishing composition can comprise about 1 ppm to about 1000 ppm of the cobalt corrosion inhibitor, about 10 ppm to about 900 ppm, about 10 ppm to about 800 ppm, about 10 ppm to about 700 ppm, about 10 ppm to about 600 ppm, about 10 ppm to about 500 ppm, about 10 ppm to about 400 ppm, about 20 ppm to about 300 ppm, about 30 ppm to about 200 ppm, about 30 ppm to about 150 ppm, about 30 ppm to about 100 ppm, or about 50 ppm to about 100 ppm.

It will be appreciated that, depending on the pH of the polishing composition, the aforementioned sarcosine derivatives can exist in the form of a salt (e.g., a metal salt, an ammonium salt, or the like), an acid, or as a mixture of an acid and a salt thereof. The acid or salt forms or mixtures thereof of the sarcosine derivatives are suitable for use in the preparation of the polishing composition.

The polishing composition comprises an oxidizing agent that oxidizes a transition metal. Preferably, the oxidizing agent oxidizes cobalt. The oxidizing agent can be any suitable oxidizing agent having an oxidation potential of sufficient magnitude at the pH of the polishing composition to oxidize cobalt. In a preferred embodiment, the oxidizing agent is hydrogen peroxide.

The polishing composition can comprise any suitable amount of the oxidizing agent. The polishing composition preferably comprises about 10 wt % or less (e.g., about 8 wt % or less, about 6 wt % or less, about 4 wt % or less, about 2 wt % or less, about 1 wt % or less, or about 0.5 wt % or less) of hydrogen peroxide.

The polishing composition can have any suitable pH. Typically, the polishing composition can have a pH of about 3 or more, e.g., about 3.5 or more, about 4 or more, about 4.5 or more, about 5 or more, about 5.5 or more, about 6 or more, about 6.5 or more, or about 7 or more. Alternatively, or in addition, the polishing composition can have a pH of about 8.5 or less, e.g., about 8.4 or less, about 8.3 or less, about 8.2 or less, about 8.1 or less, or about 8 or less. Thus, the polishing composition can have a pH bounded by any two of the above endpoints recited for the polishing composition. For example the polishing composition can have a pH of about 3 to about 8.5, e.g., about 3.5 to about 8.5, about 4 to about 8.5, about 4.5 to about 8.5, about 5 to about 8.5, about 5.5 to about 8.5, about 6 to about 8.5, about 6.5 to about 8.5, about 6.5 to about 8.4, about 6.5 to about 8.3, about 6.5 to about 8.2, about 6.5 to about 8.1, or about 6.5 to about 8.

The pH of the polishing composition can be adjusted using any suitable acid or base. Non-limiting examples of suitable acids include nitric acid, sulfuric acid, phosphoric acid, and organic acids such as acetic acid. Non-limiting examples of suitable bases include sodium hydroxide, potassium hydroxide, and ammonium hydroxide.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 to about 50 ppm, preferably about 10 to about 40 ppm, more preferably about 20 to about 30 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, cobalt accelerator, cobalt corrosion inhibitor, oxidizing agent, optional pH adjustor, etc.) as well as any combination of ingredients (e.g., abrasive, cobalt accelerator, cobalt corrosion inhibitor, oxidizing agent, optional pH adjustor, etc.).

For example, the abrasive can be dispersed in water. The cobalt accelerator and cobalt corrosion inhibitor can then be added, and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, within about 7 days before use, or within about 14 days before use). The polishing composition also can be prepared by mixing the components at the surface of the substrate during the polishing operation.

The polishing composition can be supplied as a one-package system comprising abrasive, cobalt accelerator, cobalt corrosion inhibitor, oxidizing agent, optional pH adjustor, and water. Alternatively, the abrasive can be supplied as a dispersion in water in a first container, and the cobalt accelerator, cobalt corrosion inhibitor, oxidizing agent, and optional pH adjustor can be supplied in a second container, either in dry form, or as a solution or dispersion in water. The oxidizing agent desirably is supplied separately from the other components of the polishing composition and is combined, e.g., by the end-user, with the other components of the polishing composition shortly before use (e.g., 2 weeks or less prior to use, 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, cobalt accelerator, cobalt corrosion inhibitor, and optional pH adjustor, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the abrasive, cobalt accelerator, cobalt corrosion inhibitor, and optional pH adjustor can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the oxidizing agent in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that contains cobalt. A preferred substrate comprises at least one layer, especially an exposed layer for polishing, comprising, consisting essentially of, or consisting of cobalt, such that at least a portion of the cobalt is abraded (i.e., removed) to polish the substrate. Particularly suitable substrates include, but are not limited to, wafers used in the semiconductor industry. The wafers typically comprise or consist of, for example, a metal, metal oxide, metal nitride, metal composite, metal alloy, a low dielectric material, or combinations thereof. The method of the invention is also useful for polishing substrates comprising cobalt and cobalt alloys useful in turbine blades for gas turbines and jet aircraft engines, orthopedic implants, prosthetic parts such as hip and knee replacements, dental prosthetics, high speed steel drill bits, and permanent magnets.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, polyisocyanurate, co-formed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, dishing, and erosion.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

Without wishing to be bound by any particular theory, it is believed that, in a pH range of 3-8.5, the cobalt surface is composed of a thin oxide-hydroxide layer. The $Co^{2+}$ surface can be hydrolyzed to form $Co(OH)_2$, which is a weak base that can dissociate into cobalt cations and hydroxide anions as follows:

$$CoO + H_2O \rightarrow Co(OH)_2 \rightarrow Co^{2+} + 2OH^-.$$

An effective cobalt accelerator is believed to chelate $Co^{2+}$ and, in addition, effectively neutralize the formed hydroxide, so as to avoid an increase in pH with a concomitant formation of a passivated cobalt surface. Accelerators comprising amine functional groups can react with cobalt as follows:

$$Co^{2+} + 2OH^- + 2RNH \rightarrow Co(RN)_2 + 2H_2O.$$

Thus, amino-containing accelerators can chelate or otherwise coordinate $Co^{2+}$ and, in addition, also effectively neutralize the formed hydroxide.

In addition, in the pH range of 3-8.5, the cobalt surface is thought to be positively charged. A corrosion inhibitor comprising an anionic head group and aliphatic tail group is believed to assemble at the cobalt surface via electrostatic attraction. In this particular embodiment, an effective cobalt accelerator has a net negative charge at the pH of the polishing composition in order to compete with the cobalt corrosion inhibitor at the cobalt surface and, therefore, allow for an increase in the cobalt removal rate.

The invention is exemplified by the following embodiments:

1. A chemical-mechanical polishing composition comprising:
   (a) abrasive particles,
   (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids; and combinations thereof,
   (c) a cobalt corrosion inhibitor,
   (d) an oxidizing agent that oxidizes cobalt, and
   (e) water,
wherein the polishing composition has a pH of about 3 to about 8.5.

2. The polishing composition of embodiment 1, wherein the polishing composition comprises about 0.1 wt % to about 2 wt % of abrasive particles.

3. The polishing composition of embodiment 1 or 2, wherein the cobalt accelerator is selected from iminodiacetic acid, picolinic acid, dipicolinic acid, bicine, [(2-amino-2-oxoethyl)amino]acetic acid, lysine, imidazole, histidine, 2-[bis(2-hydroxyethyl)amino]-2-(hydroxymethyl)-1,3-propanediol, and combinations thereof.

4. The polishing composition of any one of embodiments 1-3, wherein the cobalt accelerator is present in the polishing composition in a concentration of about 5 mM to about 100 mM.

5. The polishing composition of any one of embodiments 1-4, wherein the cobalt corrosion inhibitor comprises an anionic head group and a $C_8$-$C_{14}$ aliphatic tail group.

6. The polishing composition of embodiment 1, wherein the cobalt corrosion inhibitor has the formula: $RCON(CH_3)COOH$ wherein R is a $C_8$-$C_{13}$ aliphatic group.

7. The polishing composition of any one of embodiments 1-6, wherein the polishing composition comprises about 10 ppm to about 1000 ppm of the cobalt corrosion inhibitor.

8. The polishing composition of any one of embodiments 1-7, wherein the oxidizing agent is hydrogen peroxide.

9. The polishing composition of embodiment 1, wherein the polishing composition has a pH of about 7 to about 8.

10. A method of chemically mechanically polishing a substrate comprising:
   (i) contacting a substrate with a polishing pad and a chemical-mechanical polishing composition of any one of embodiments 1-9,
   (ii) moving the polishing pad and the chemical mechanical polishing composition relative to the substrate, and
   (iii) abrading at least a portion of the substrate to polish the substrate.

11. The method of embodiment 10, wherein the substrate comprises cobalt, and least a portion of the cobalt is abraded to polish the substrate.

12. The method of embodiment 10 or 11, wherein the substrate comprises a semiconductor device.

The following examples further illustrate the invention but, of course, should not be construed as in any way limiting its scope.

EXAMPLE 1

This example demonstrates the cobalt removal rate exhibited by polishing compositions comprising a cobalt accelerator without a cobalt corrosion inhibitor. Separate substrates comprising a blanket layer of cobalt were polished with Polishing Compositions 1A-1V. Polishing Compositions 1A-1S are inventive polishing compositions. Polishing Compositions 1T-1V are comparative polishing compositions. All of the polishing compositions contained 0.5 wt % of wet-process silica having an average particle size of 70 nm (silica obtained from Fuso Chemical Co., Japan), 1 wt % of hydrogen peroxide at a pH of 5-7, and accelerators at concentrations around 40 mM. The accelerators were as set forth in Table 1. Following polishing, the cobalt removal rates were determined, and the results set forth in Table 1. The relative rate is calculated relative for the removal rate observed for Polishing Composition 1R, which contained glycine.

TABLE 1

| Polishing Composition | Accelerator | Maximum Co Removal Rate (Å/min) | Relative Rate |
|---|---|---|---|
| 1A | Triethanolamine | 4167 | 4.0 |
| 1B | Bicine | 4149 | 4.0 |
| 1C | [(2-Amino-2-oxoethyl)amino]acetic acid | 3439 | 3.3 |

TABLE 1-continued

| Polishing Composition | Accelerator | Maximum Co Removal Rate (Å/min) | Relative Rate |
|---|---|---|---|
| 1D | 2-Amino-2-oxoethylglycine | 3436 | 3.3 |
| 1E | Nitrilotriacetic acid | 2892 | 2.8 |
| 1F | N-methylimidazole | 3429 | 3.3 |
| 1G | ADA | 2872 | 2.8 |
| 1H | Picolinic acid | 2781 | 2.7 |
| 1I | Iminodiacetic acid | 2568 | 2.5 |
| 1J | DL-Lysine | 2430 | 2.4 |
| 1K | Dipicolinic acid | 2419 | 2.4 |
| 1L | Arginine | 2049 | 2.0 |
| 1M | DL-Serine | 2019 | 2.0 |
| 1N | Imidazole | 2007 | 2.0 |
| 1O | HEPES | 206 | 1.9 |
| 1P | Histidine | 2000 | 1.9 |
| 1Q | Bis Tris | 1948 | 1.9 |
| 1R | Glycine | 1029 | 1.0 |
| 1S | Alanine | 823 | 0.8 |
| 1T | Tartaric acid | 740 | 0.7 |

As is apparent from the results set forth in Table 1, inventive Polishing Compositions 1A-1Q, which contained 40 mM accelerators, exhibited cobalt removal rates that were approximately 1.9 to 4.0 times greater than comparative Polishing Composition 1R, which contained glycine.

EXAMPLE 2

This example demonstrates the cobalt removal rate exhibited by polishing compositions comprising a cobalt accelerator both with and without a cobalt corrosion inhibitor.

Sixteen similar substrates comprising cobalt blanket layers were separately polished on one side with 16 different polishing compositions. Each of the polishing compositions comprised 1 wt % of wet-process silica and 1 wt % of hydrogen peroxide. Individual polishing compositions further contained bicine, HEPES ((4-(2-hydroxyethyl)-1-piperazineethanesulfonic acid)), ethanolamine, N-methylimidazole, triethanolamine, nitrilotriacetic acid, dipicolinic acid, or iminodiacetic acid as cobalt accelerators, and either no cobalt corrosion inhibitor or 75 ppm of N-cocoyl sarcosine (i.e., a cobalt corrosion inhibitor).

Following polishing, the cobalt removal rate was determined for each substrate. The results are set forth in Table 2. Table 2 further sets forth the percent change in removal rate observed in the presence of the cobalt corrosion inhibitor as compared with the removal rate in the absence of the cobalt corrosion inhibitor, as well as the net charge of the cobalt corrosion inhibitor at the indicated pH.

TABLE 2

| Accelerator | Co RR (Å/min) (no inhibitor) | Co RR (Å/min) (with inhibitor) | pH | % Change | Net charge at pH |
|---|---|---|---|---|---|
| Bicine | 2704 | 20 | 6.0 | −99 | 0 |
| HEPES | 2007 | 40 | 5.0 | −98 | 0 |
| Ethanolamine | 1249 | 138 | 6.0 | −89 | +1 |
| N-Methylimidazole | 3429 | 290 | 6.5 | −92 | +0.67 |
| Triethanolamine | 3260 | 578 | 6.0 | −82 | +1 |
| Nitriloacetic acid | 1921 | 1403 | 6.0 | −27 | −2.72 |
| Dipicolinic acid | 2419 | 2108 | 6.0 | −13 | −2 |
| Iminodiacetic acid | 2568 | 2638 | 6.0 | +3 | −1 |

As is apparent from the results set forth in Table 1, the polishing compositions with the cobalt accelerators that had a negative net charge at the pH of the polishing composition exhibited cobalt removal rates ranging from a decrease of approximately −27% to a slight increase of approximately +3%. The polishing compositions with the cobalt accelerators that had a neutral or positive net charge at the pH of the polishing composition exhibited substantially reduced cobalt removal rates ranging from a decrease of approximately −82% to a decrease of approximately −99%.

EXAMPLE 3

This example demonstrates cobalt removal rates exhibited by polishing compositions comprising iminodiacetic acid as a cobalt accelerator, in accordance with an embodiment of the invention.

Five different substrates comprising cobalt blanket layers were separately polished on one side with five different polishing compositions, Polishing Compositions 3A-3E. All of the polishing compositions contained 2 wt. % of wet-process silica having an average particle size of 70 nm or wet-process silica having an average particle size of 100 nm (both silicas were obtained from Fuso Chemical Co., Japan) and 1 wt % of hydrogen peroxide at a pH of 7-8. Polishing Composition 3A (invention) further contained iminodiacetic acid at a concentration of 41 mM and wet-process silica having an average particle size of 70 nm. Polishing Composition 3B (invention) further contained iminodiacetic acid at a concentration of 41 mM and wet-process silica having an average particle size of 100 nm. Polishing Composition 3C (invention) further contained iminodiacetic acid at a concentration of 100 mM and wet-process silica having an average particle size of 100 nm. Polishing Composition 3D (comparative) further contained glycine at a concentration of 41 mM and wet-process silica having an average particle size of 70 nm. Polishing Composition 3E (comparative) further contained glycine at a concentration of 100 mM and wet-process silica having an average particle size of 100 nm.

Following polishing, the cobalt removal rate was determined for each substrate. The results are set forth in Table 3.

TABLE 3

| Polishing Composition | Additive (concentration, mM) | Silica Average Particle Size | Co RR (Å/min) |
|---|---|---|---|
| 3A (invention) | Iminodiacetic acid (41 mM) | 70 nm | 3300 |
| 3B (invention) | Iminodiacetic acid (41 mM) | 100 nm | 3500 |
| 3C (invention) | Iminodiacetic acid (100 mM) | 100 nm | 3100 |
| 3D (comparative) | Glycine (41 mM) | 70 nm | 1600 |
| 3E (comparative) | Glycine (100 mM) | 100 nm | 1550 |

As is apparent from the results set forth in Table 3, inventive Polishing Compositions 3A-3C, which contained iminodiacetic acid, exhibited cobalt removal rates that were approximately 1.93 to 2.26 times greater than comparative Polishing Compositions 3D and 3E, which contained glycine.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically mechanically polishing a substrate comprising:
    contacting a substrate with a polishing pad and a chemical-mechanical polishing composition comprising:
        (a) abrasive particles,
        (b) a cobalt accelerator selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl)amino acids; unsubstituted heterocycles; alkyl-substituted heterocycles; substituted-alkyl-substituted heterocycles; N-aminoalkyl-α-amino acids,
        (c) a cobalt corrosion inhibitor, wherein the cobalt corrosion inhibitor comprises an anionic head group and a $C_8$-$C_{14}$ aliphatic tail group; and combinations thereof,
        (d) an oxidizing agent that oxidizes cobalt, and
        (e) water,
    wherein the polishing composition has a pH of about 3 to about 8.5,
        (ii) moving the polishing pad and the chemical mechanical polishing composition relative to the substrate, and
        (iii) abrading at least a portion of the substrate to polish the substrate.

2. The method of claim 1, wherein the polishing composition comprises about 0.1 wt. % to about 2 wt. % of abrasive particles.

3. The method of claim 1, wherein the cobalt accelerator is selected from iminodiacetic acid, picolinic acid, dipicolinic acid, bicine, [(2-amino-2-oxoethyl)amino]acetic acid, lysine, imidazole, histidine, and 2-[bis(2-hydroxyethyl)amino]-2-(hydroxymethyl)-1,3-propanediol.

4. The method of claim 1, wherein the cobalt accelerator is present in the polishing composition in a concentration of about 5 mM to about 100 mM.

5. The method of claim 1, wherein the cobalt corrosion inhibitor has the formula: $RCON(CH_3)COOH$ wherein R is a $C_8$-$C_{13}$ aliphatic group.

6. The method of claim 1, wherein the polishing composition comprises about 10 ppm to about 1000 ppm of the cobalt corrosion inhibitor.

7. The method of claim 1, wherein the oxidizing agent is hydrogen peroxide.

8. The method of claim 1, wherein the polishing composition has a pH of about 7 to about 8.

9. The method of claim 1, wherein the substrate comprises cobalt, and least a portion of the cobalt is abraded to polish the substrate.

10. The method of claim 9, wherein the substrate comprises a semiconductor device.

* * * * *